United States Patent
Kagan

(10) Patent No.: US 7,313,489 B2
(45) Date of Patent: *Dec. 25, 2007

(54) SYSTEM AND METHOD UTILIZING VIRTUAL SWITCHING FOR ELECTRICAL PANEL METERING

(75) Inventor: Erran Kagan, Great Neck, NY (US)

(73) Assignee: Electro Industries/GaugeTech, Westbury, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/643,427

(22) Filed: Dec. 21, 2006

(65) Prior Publication Data

US 2007/0118306 A1    May 24, 2007

Related U.S. Application Data

(63) Continuation of application No. 10/896,489, filed on Jul. 22, 2004, now Pat. No. 7,155,350.

(51) Int. Cl.
*G01R 21/00*    (2006.01)

(52) U.S. Cl. ............... 702/61; 702/64; 702/57; 324/114; 307/115; 307/126

(58) Field of Classification Search ............... 702/61
See application file for complete search history.

(56) References Cited

U.S. PATENT DOCUMENTS

| | | | | |
|---|---|---|---|---|
| 5,742,512 | A * | 4/1998 | Edge et al. | 702/57 |
| 6,459,258 | B1 * | 10/2002 | Lavoie et al. | 324/142 |
| 6,486,652 | B1 * | 11/2002 | Ouellette et al. | 324/142 |
| 6,738,693 | B2 * | 5/2004 | Anderson | 700/291 |
| 7,155,350 | B2 * | 12/2006 | Kagan | 702/57 |
| 7,209,049 | B2 * | 4/2007 | Dusenberry et al. | 340/870.02 |
| 2003/0076242 | A1 * | 4/2003 | Burns et al. | 340/870.02 |
| 2003/0137976 | A1 * | 7/2003 | Zhu et al. | 370/354 |

* cited by examiner

*Primary Examiner*—Hal Wachsman
(74) *Attorney, Agent, or Firm*—Carter, DeLuca, Farrell & Schmidt, LLP

(57)    ABSTRACT

A system and method utilizing virtual switching in an electrical panel meter. The virtual switching enables the meter to be upgraded or downgraded through a switching signal, by activating or deactivating the metering functions that are to be performed in the meter. Accordingly, when the upgrade or downgrade is necessary, the meter does not have to be replaced.

23 Claims, 3 Drawing Sheets

SYSTEM AND METHOD UTILIZING VIRTUAL SWITCHING FOR ELECTRICAL PANEL METERING

CROSS REFERENCE TO RELATED APPLICATIONS

The present application is a continuation application of U.S. application Ser. No. 10/896,489, filed Jul. 22, 2004, now U.S. Pat. No. 7,155,350, entitled "SYSTEM AND METHOD UTILIZING VIRTUAL SWITCHING FOR ELECTRICAL PANEL METERING", the contents of which are hereby incorporated by reference.

BACKGROUND OF THE INVENTION

1. Field of the Invention

The present invention relates generally to an electrical meter, and more specifically to a system and method utilizing virtual switching in an electrical panel meter.

2. Description of the Related Art

Traditionally, engineering people would populate substation electrical panels with discreet panel meters that were analog in nature and based on a needle. As metering technology progressed, these discreet panel meters became digitally based. Additionally, meters that started as single function instruments have progressed to being multifunction instruments.

A problem occurring in the prior art is that most meters with multiple features have a higher cost, and if a sufficient budget is not available at the time of the purchase, a lower and simpler meter is installed. Further, at a later date, a customer (or user) wishing to receive more functions from their meter would have to remove the meter, i.e., either replace it for higher featured unit, or send the meter away for an upgrade. This is often costly because it requires shutdowns of the devices/systems being metered and changes to the wiring of a panel. Moreover, in critical applications such as hospitals, data centers, or power plants, these shutdowns are often impossible.

Accordingly, there is a need in the market for a cost efficient multifunction meter for providing selected metering functions without requiring a user to shutdown operations and reconfigure panel wiring.

SUMMARY OF THE INVENTION

It is, therefore, as object of the present invention to provide a system and method utilizing virtual switching for electrical panel metering.

It is another object of the present invention to provide a business method utilizing virtual switching for electrical panel metering.

According to a first aspect of the present invention, the above and other objects of the present invention are provided by an electrical metering device for performing multiple metering functions comprising: a virtual switching unit including a plurality of virtual switches for selectively activating and deactivating the virtual switches according to a received switching signal; and a function operating unit for performing the multiple metering functions that are activated by the virtual switches.

According to another aspect of the present invention a method of performing multiple metering functions comprises: selectively activating and deactivating virtual switches according to a received switching signal; and performing the multiple metering functions that are activated by the virtual switches.

According to yet another aspect of the present invention a method for providing meter service comprises: providing a user with a meter that is for performing multiple metering functions; activating and deactivating virtual switches included in the meter according to a received switching signal; and charging the user based upon a number of the multiple metering functions that are activated.

BRIEF DESCRIPTION OF THE DRAWINGS

The above and other objects, features, and advantages of the present invention will become more apparent from the following detailed description when taken in conjunction with the following drawings in which.

DETAILED DESCRIPTION OF THE PREFERRED EMBODIMENT

A preferred embodiment of the present invention will now be described in detail herein below with reference to the annexed drawings. In the following description, a detailed description of known functions and configurations incorporated herein has been omitted for conciseness.

The virtual switch technology utilizes the benefit of the microprocessor to separate features based on functions so that a single meter, which performs multiple metering functions, such as measuring voltage, current, watts, vars, frequency, power, watt-hours, var/hours, demand, harmonics, etc., can be purchased at a price corresponding to a basic metering device including a user's immediate metering needs. This meter, after being installed, can be upgraded or downgraded by enabling or disabling any of the multiple functions, without having to replace the meter itself.

For example, a user will install a meter that will only measure voltage and current used by a system. However, over time, as the system is upgraded, a user must measure more electrical characteristics of the system. Therefore the user must upgrade the meter. As described above, in a conventional metering device, the user would have to replace the meter or at least have the meter removed in order to be upgraded. However, in the meter according to the present invention, the user can simply upgrade the current meter by virtually switching on the new metering function, which is already included in the meter.

The present invention provides a more cost efficient product to a user in that the user can either initially purchase this multifunction meter for performing all possible metering functions, or the user may purchase the meter, only paying for the desired metering functions that the user wishes to receive at that the present time. In the latter situation, when the user wishes to upgrade the metering capabilities, rather than have to replace the existing meter, the user can pay the meter provider to virtually switch on the desired metering functions, thereby upgrading the metering service without having to replace the meter.

Accordingly, it is also possible that a user could save money by downgrading a meter through virtual switching, during which the user would have a metering function disabled. The user would then stop paying for that specific metering function.

Figure 1:
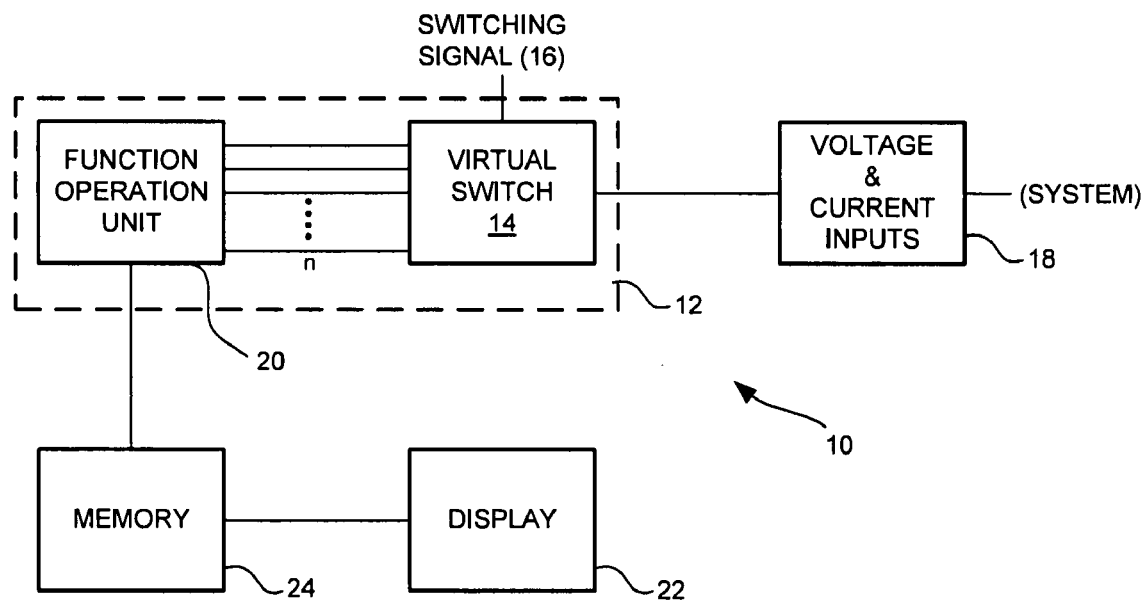
FIG. 1 illustrates a block diagram of a panel meter including virtual switches according to a preferred embodiment of the present invention.

FIG. 1 illustrates a block diagram of a panel meter 10 including virtual switches according to a preferred embodiment of the present invention. The meter 10 is a multifunction device for circuit monitoring for main feeds, branch circuits, gensets and equipment and may replace all individual single and multi-function meters and transducers. Accordingly, the meter 10 can be used for utility submetering, tenant metering, substation automation, generator monitoring and the like. Among numerous functions, the meter 10 can provide complete access to all voltage, current, and power values through an easy use of display and through the TCP/IP Ethernet LAN, WAN and/or Internet. The functions performed by the meter may include, among others, measuring watts, vars, frequency, power, watt-hours, var/hours, demand, harmonics, etc.

Referring to FIG. 1, the inventive meter 10 is configured with voltage and current inputs 18, a processor 12, a memory (or storage device) 24, and a display 22. The voltage and current inputs 18, which are provided from the metered system, are transmitted to the processor 12, which controls the desired metering functions of the input signals 18. The metering results are then stored in the memory 24 and can be displayed on the display 22.

More specifically, the processor 12 comprises a virtual switching unit 14 and a function operation unit 20. The virtual switching unit 14 controls which functions are performed in the function operation unit 20, based on a switching signal 16. In a preferred embodiment, the input signal 16 may include a unique code based on the unique serial number of the device 10 and assigned to a particular one of the multiple functions, which are stored in a function operating unit 20 of the microprocessor 12. As described above, the function operation unit 20 performs multiple metering functions, such as measuring voltage, current, watts, vars, frequency, power, watt-hours, var/hours, demand, harmonics, etc.

Figure 1A:
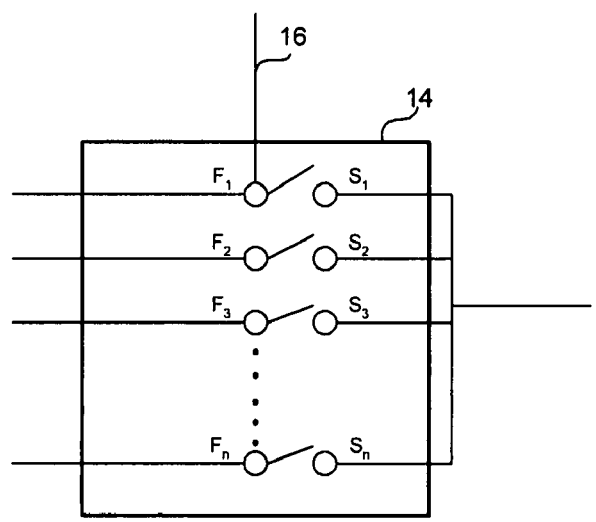
FIG. 1A illustrates a block diagram of the virtual switch unit of FIG. 1, according to a preferred embodiment of the present invention.

FIG. 1A illustrates a block diagram of the virtual switch unit 14 of FIG. 1. Referring to FIG. 1A, the virtual switch unit 14 includes a plurality of virtual switches that correspond to each available metering function. For example, in FIG. 1A, the virtual switch unit 14 includes virtual switches $S_1, S_2, S_3, \ldots, S_n$ that correspond to each available metering function $F_1, F_2, F_3, \ldots, F_n$. When the switching signal indicates that functions $F_1$ and $F_3$ should be activated, switches $S_1$ and $S_3$ are closed, thereby allowing the function operation unit 20 to perform functions $F_1$ and $F_3$.

Alternatively, if all the functions $F_1, F_2, F_3, \ldots, F_n$ are currently being used and the switching signal indicates that functions $F_1$ and $F_3$ should be deactivated, switches $S_1$ and $S_3$ are opened, thereby disabling the function operation unit 20 to perform functions $F_1$ and $F_3$.

Note that the virtual switch does not have to be necessarily implemented as hardware, but can be realized by software. Advantageously, the microprocessor can be provided with software, which is operative to "turn on" the desired function. As such, the software operates as a virtual switch unit 14 coupled to the function-operating unit 20.

Once a new function or operation is activated, the consumer may read its description on a display 22 that can be configured as a touch screen illustrating all of the activated functions.

Figure 2:
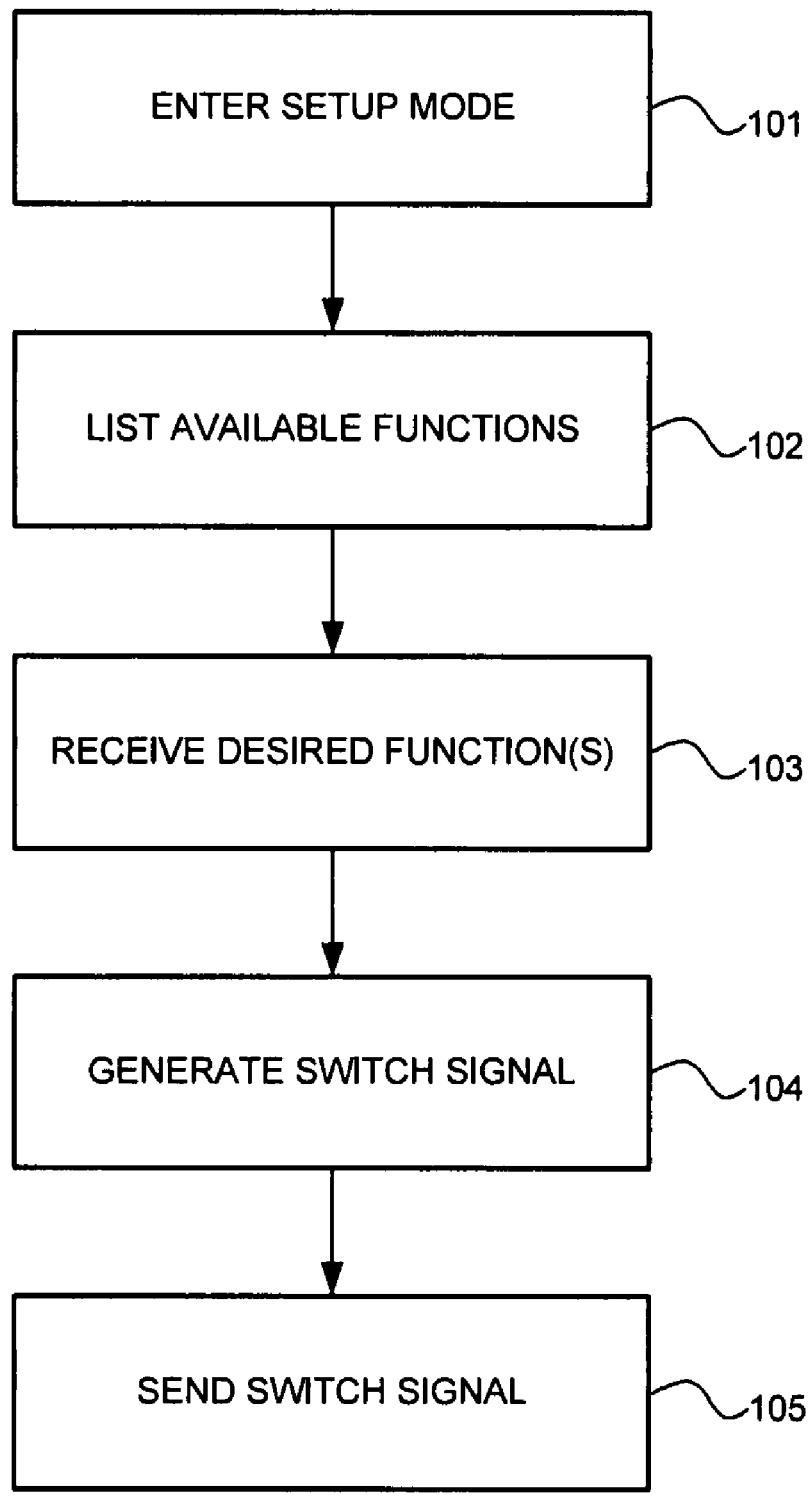
FIG. 2 is a flow chart illustrating a method of controlling the virtual switches according to a preferred embodiment of the present invention.

FIG. 2 is a flow chart illustrating a method of controlling the virtual switches according to a preferred embodiment of the present invention. As indicated above, the virtual switches are controlled by a switching signal. The switching signal can be generated by the user or by a service provider, i.e., the supplier of the meter. Additionally, the switching signal can be generated directly in the meter itself, using in an input device such as a key pad or touch screen, or generated at an outside source and transmitted to the meter via the internet, telephone lines, dedicated control lines, wireless transmission, etc.

Referring to FIG. 2, a user with authorization to change the metering functions enters a setup mode in step 101. Upon entry into the setup mode, preferably a list of all available functions is present to the user in step 102. In step 103, the user enables or disables the desired function or functions from the list, and generates the switch signal in step 104. In step 105, the switch signal is sent to the processor in the meter, and the corresponding functions are activated or deactivated through virtual switching.

In a preferred embodiment, the switching signal uses an encryption algorithm based on the serial number of the meter to allow the user to enter a unique code for changing the adding feature to the product.

Figure 3:
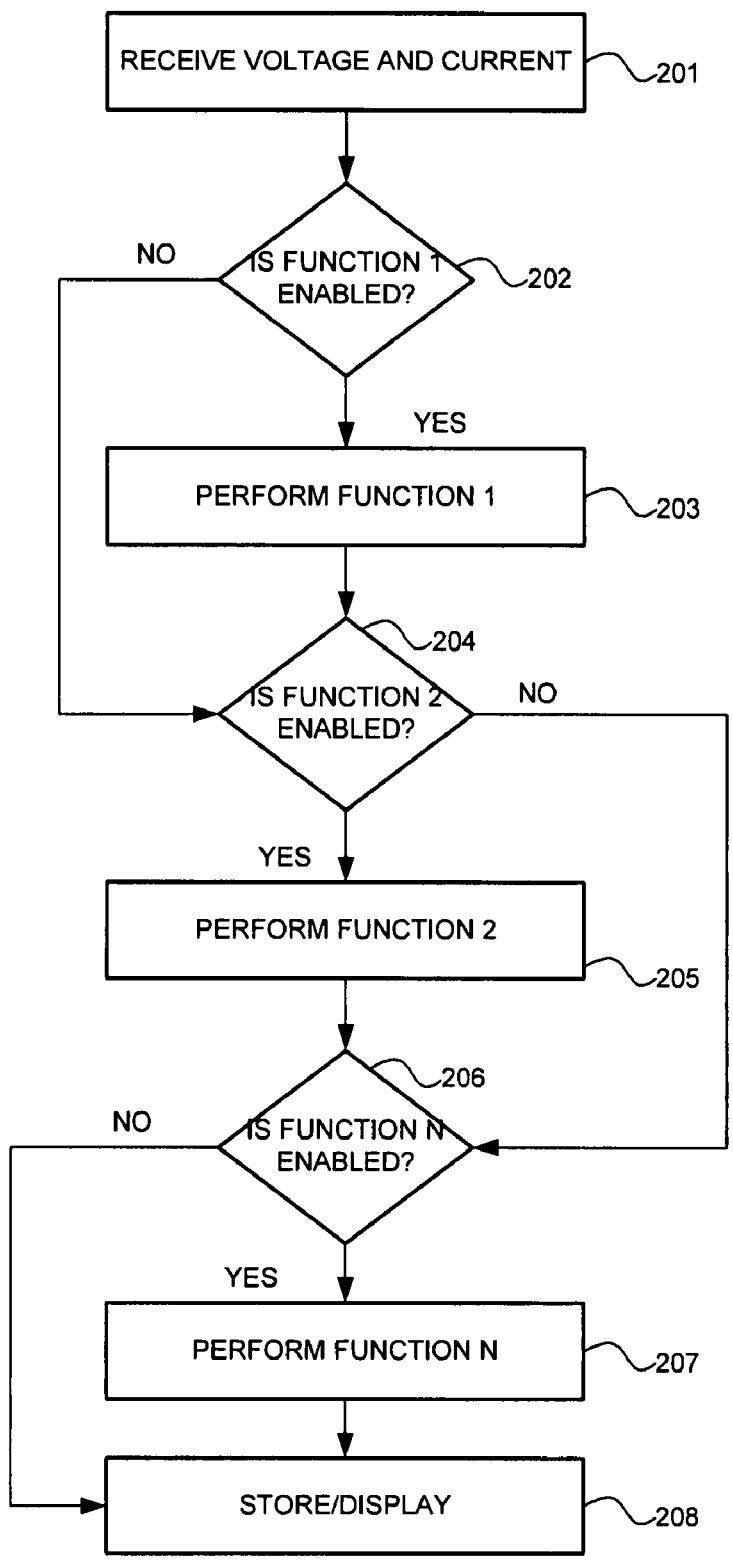
FIG. 3 is a flow chart illustrating a method of operation of a panel meter including virtual switches according to a preferred embodiment of the present invention.

FIG. 3 is a flow chart illustrating a method of operation of a panel meter including virtual switches according to a preferred embodiment of the present invention. Referring to FIG. 3, in step 201 the meter receives the input signals. In step 202, it is determined whether a first metering function is activated (or enabled). If the first metering function is activated, the first metering function is performed in step 203, and the result are stored and can be displayed in step 208.

If the first metering function is not activated in step 202 or after the first metering function is performed in step 203, it is determined whether a second metering function is activated (or enabled) in step 204. If the second metering function is activated, the second metering function is performed in step 205, and the result are stored and can be displayed in step 208.

As is illustrated in FIG. 3, the method can be performed for N different functions. Therefore, if the second metering function is not activated in step 204 or after the second metering function is performed in step 205, it is determined whether an Nth metering function is activated (or enabled) in step 206. If the Nth metering function is activated, the Nth metering function is performed in step 207, and the result are stored and can be displayed in step 208.

Accordingly, a meter utilizing virtual switching according to the present invention is highly advantageous because of the following:

1. Meters can be installed in a cost-efficient manner and upgraded later;

2. Maintenance of the inventive meters is also cost-efficient since there is no need to replace originally installed meters with new and more expensive ones;

3. Manufacturability of the meters is more efficient since fewer types of meters are needed; and 4. The customer is capable of maximizing capital budgets.

While the present invention has been shown and described with reference to a certain preferred embodiment thereof, it will be understood by those skilled in the art that various changes in form and details, may be made therein without departing from the spirit and scope of the present invention.

What is claimed is:

1. A system for providing metering service comprising:
at least one electrical metering device for controlling multiple metering functions coupled to a network, the at least one electrical metering device including:
a function operating unit storing the multiple metering functions; and
a virtual switching unit including a plurality of virtual switches, each virtual switch corresponding to each available metering function for selectively activating and deactivating the corresponding metering function, wherein the virtual switching unit is configured for receiving a single switching signal indicating which of at least two of the available metering functions are to be activated and activating or deactivating the corresponding virtual switches; and
a service provider coupled to the network for generating the single switching signal.

2. The system of claim 1, wherein the at least one electrical metering device further comprising:
a memory for storing readings of the multiple metering functions; and
a display for displaying the readings of the multiple metering functions.

3. The system of claim 2, wherein the display comprises a touch screen.

4. The system of claim 1, wherein the virtual switching unit is provided with software operative to selectively active and deactivate the multiple metering functions in response to the single switching signal.

5. The system of claim 1, wherein the virtual switching unit is provided with hardware operative to selectively active and deactivate the multiple metering functions in response to the single switching signal.

6. The system of claim 1, wherein the multiple metering functions are selected from the group consisting of measuring voltage, current, vars, frequency, power, watt-hours, vars/hours, demand and harmonics.

7. The system of claim 1, wherein the single switching signal is transmitted to the at least one electrical metering device via one of the internet, a telephone line, a direct communication line, and wireless transmission.

8. The system of claim 1, wherein the single switching signal is transmitted to the at least one electrical metering device via TCP/IP.

9. The system of claim 1, wherein the single switching signal includes a unique code associated with the at least one electrical metering device.

10. The system of claim 9, wherein the unique code is generated by an encryption algorithm based on a serial number of the at least one electrical metering device.

11. The system of claim 1, further comprising an input device configured to select the at least two available metering functions, wherein the single switching signal is generated by the at least one electrical metering device based on the selected at least two available metering functions.

12. The system of claim 1, wherein the service provider is configured to generate the single switching signal in response to a request from the at least one electrical metering device.

13. The system of claim 12, wherein the at least one electrical metering device further comprises a display configured for presenting a list of available metering functions and an input device configured for enabling or disabling the at least two available metering functions, wherein the request is generated based on the enabled or disabled at least two available metering functions.

14. The system of claim 13, wherein the input device is a touchscreen or keypad.

15. In an electrical metering system including at least one electrical metering device including a function unit storing multiple electrical metering functions and a virtual switching unit including a plurality of virtual switches, each virtual switch corresponding to each available electrical metering function for selectively activating and deactivating the corresponding electrical metering function and a service provider for configuring the at least one electrical metering device, a method of upgrading the at least one electrical metering device comprising:
presenting a list of available electrical metering functions on a display of the at least one electrical metering device;
enabling or disabling at least two available electrical metering functions from the presented list and sending the enabled at least two available electrical metering functions to the service provider;
generating a single switch signal at the service provider for activating each virtual switch corresponding to each enabled electrical metering function and deactivating each virtual switch corresponding to each disabled electrical metering function; and
receiving the single switch signal by the virtual switching unit of the at least one electrical metering device;
determining which of the at least two available electrical metering functions is enabled or disabled; and
selectively activating each virtual switch corresponding to each enabled electrical metering function and deactivating each virtual switch corresponding to each disabled electrical metering function.

16. The method of claim 15, further comprising charging a user based on a number of the multiple electrical metering functions that are enabled.

17. The method of claim 15, wherein the at least one electrical metering device further comprises a display configured for presenting the list and an input device configured for enabling or disabling the at least two available electrical metering functions, wherein the single switch signal is generated in the at least one electrical metering device.

18. The method of claim 15, further comprising:
storing readings of the multiple electrical metering functions; and
displaying the readings of the multiple electrical metering functions.

19. The method of claim 15, wherein the single switch signal is transmitted to the at least one electrical metering device via one of the Ethernet and wireless transmission.

20. The method of claim 15, wherein the single switch signal is transmitted to the at least one electrical metering device via TCP/IP.

21. The method of claim 15, wherein the multiple electrical metering functions are selected from the group consisting of measuring voltage, current, vars, frequency, power, watt-hours, vars/hours, demand and harmonics.

22. The method of claim 15, wherein the single switch signal includes a unique code associated with the at least one electrical metering device.

23. The method of claim 22, wherein the unique code is generated by an encryption algorithm based on a serial number of the at least one electrical metering device.

* * * * *